United States Patent
Song

(10) Patent No.: US 7,928,779 B2
(45) Date of Patent: Apr. 19, 2011

(54) METHODS AND APPARATUSES FOR INCREMENTAL BANDWIDTH CHANGES RESPONSIVE TO FREQUENCY CHANGES OF A PHASE-LOCKED LOOP

(75) Inventor: Anfei Song, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 1 day.

(21) Appl. No.: 12/486,583

(22) Filed: Jun. 17, 2009

(65) Prior Publication Data

US 2010/0321074 A1  Dec. 23, 2010

(51) Int. Cl.
*H03L 7/06* (2006.01)
(52) U.S. Cl. .......................... 327/156; 327/147
(58) Field of Classification Search ............ 327/147, 327/156
See application file for complete search history.

(56) References Cited

U.S. PATENT DOCUMENTS

| | | | |
|---|---|---|---|
| 5,128,632 A * | 7/1992 | Erhart et al. ............... 331/1 A |
| 5,319,320 A | 6/1994 | Abe et al. |
| 5,332,930 A | 7/1994 | Volk |
| 5,630,110 A | 5/1997 | Mote, Jr. |
| 5,631,587 A | 5/1997 | Co et al. |
| 5,828,255 A | 10/1998 | Kelkar et al. |
| 6,535,986 B1 | 3/2003 | Rosno et al. |
| 6,622,254 B1 | 9/2003 | Kao |
| 6,696,886 B1 | 2/2004 | Ke et al. |
| 6,856,180 B1 * | 2/2005 | Starr et al. .................... 327/147 |
| 6,900,675 B2 * | 5/2005 | Briones ........................ 327/147 |
| 6,963,992 B1 | 11/2005 | Cheng et al. |
| 7,062,004 B1 | 6/2006 | Kim et al. |
| 7,138,839 B2 | 11/2006 | Zachan et al. |
| 7,176,738 B1 | 2/2007 | Hwang et al. |
| 7,219,252 B1 | 5/2007 | Li et al. |
| 7,308,596 B1 | 12/2007 | Hwang et al. |
| 7,330,078 B1 | 2/2008 | Li et al. |
| 7,405,628 B2 * | 7/2008 | Hulfachor et al. ............ 331/11 |
| 7,492,195 B1 * | 2/2009 | Patil ............................ 327/156 |
| 7,602,226 B1 * | 10/2009 | Hwang et al. ............... 327/291 |
| 7,750,696 B2 * | 7/2010 | Wang et al. .................. 327/156 |
| 7,750,742 B2 * | 7/2010 | Cho et al. ...................... 331/18 |
| 2004/0232995 A1 * | 11/2004 | Thomsen et al. .............. 331/2 |
| 2009/0111409 A1 | 4/2009 | Sun et al. |

* cited by examiner

*Primary Examiner* — Lincoln Donovan
*Assistant Examiner* — Adam D Houston
(74) *Attorney, Agent, or Firm* — Traskbritt, P.C.

(57) ABSTRACT

In a phase-locked loop, a desired change in frequency is indicated. The phase-locked loop locks to the new frequency and a loop bandwidth of the phase-locked loop is changed. In changing the loop bandwidth, a frequency adjustment signal to a voltage-controlled oscillator may include a voltage spike. The voltage spike is reduced by detecting a lock when the reference clock and a feedback clock reach a same frequency, then waiting for a time delay after the detecting the lock, and adjusting a current level of a charge pump pulse by an incremental amount to achieve a fractional portion of a new loop bandwidth. The charge pump pulse is filtered to generate the frequency adjustment signal and the frequency spike reduction process is repeated until the new loop bandwidth is achieved.

15 Claims, 5 Drawing Sheets

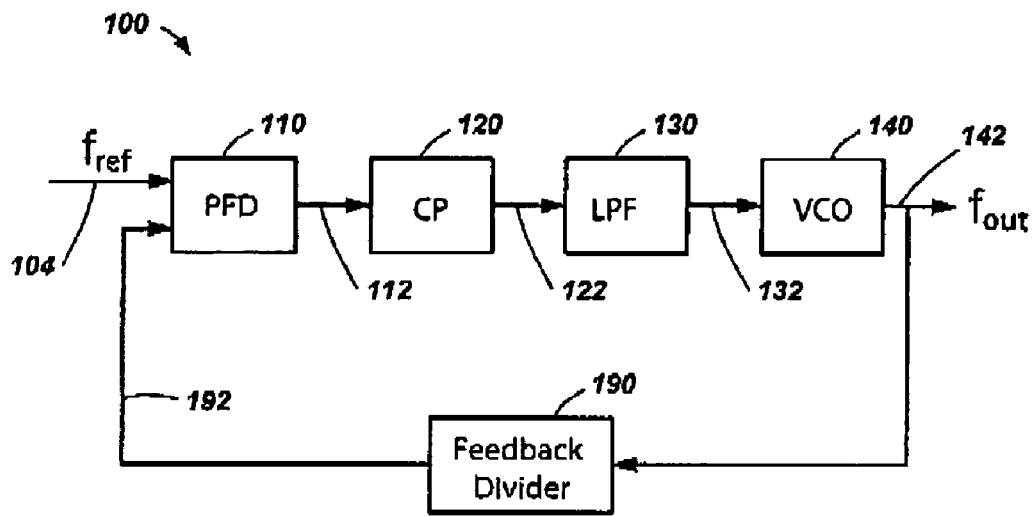
FIG. 1
(PRIOR ART)
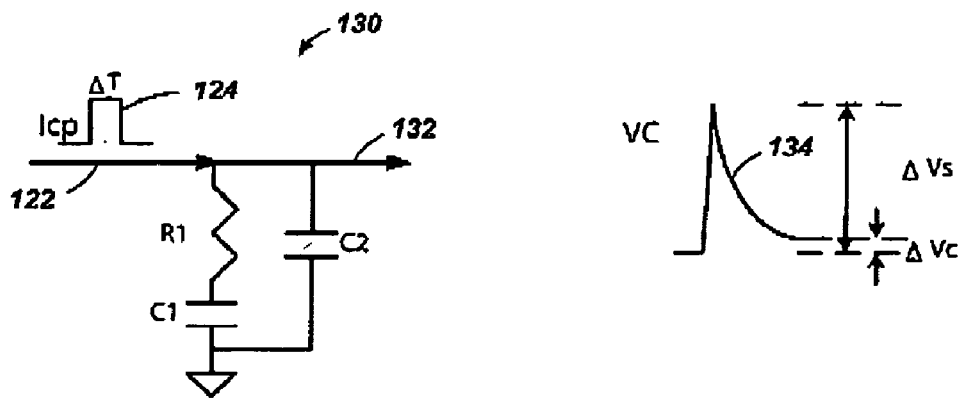
FIG. 2A
(PRIOR ART)
FIG. 2B
(PRIOR ART)

METHODS AND APPARATUSES FOR INCREMENTAL BANDWIDTH CHANGES RESPONSIVE TO FREQUENCY CHANGES OF A PHASE-LOCKED LOOP

TECHNICAL FIELD

Embodiments of the present disclosure relate generally to phase-locked loops and, more particularly, to methods and apparatuses for adjusting a loop bandwidth of the phase-locked loops.

BACKGROUND

In modern high frequency integrated circuits, it is often necessary to generate internal clocks at different frequencies from a reference clock. Conventionally, a Phase-Locked Loop (PLL) or a Delay-Locked Loop (DLL) has been used to generate a clock at the different frequency.

Devices in a computer, such as a CPU, a memory and a video card, normally operate at a standard frequency. However, in order to achieve higher performance, many consumers "overclock" the normal operating frequency of these devices, making them operate faster due to the higher clock frequency. This overclocking can cause a number of problems. Some of these problems may be improper function of the device because it cannot operate properly at the higher frequency and overheating of the device.

Another problem is stability of a PLL responding to the change in the clock frequency. To enhance PLL stability, a frequency ramp ratio and frequency spike during overclocking should be limited to some extent in order to keep the system working normally. Common rules of thumb are to maintain the frequency ramp to 1 MHz/microsecond or less and to maintain frequency spikes to 1 MHz or less.

A common way to meet these overclock requirements is to employ a small bandwidth for the PLL while overclocking and a normal larger bandwidth for the PLL after overclocking. The small bandwidth allows the PLL to track a frequency change in a relatively long time, meeting the frequency ramp ratio requirement. However, large changes in the bandwidth of a PLL can cause large frequency spikes, which may fail the frequency spike requirements.

There is a need for an improved PLL that can respond to these reference clock frequency changes while staying stable and not causing the device with the PLL to malfunction due to the PLL adapting to the new frequency.

BRIEF SUMMARY OF THE INVENION

Embodiments of the present invention include methods of phase locking to a reference clock and phase-locked loops that adjust to a change in frequency of the phase-locked loop. The phase-locked loop locks to a new reference frequency and incrementally adjusts a loop bandwidth in response to the frequency change.

In one embodiment of the invention, a phase-locked loop includes a phase-frequency detector for comparing a reference clock and a feedback clock to generate a difference signal and a lock detector compares the reference clock and the feedback clock to assert a lock signal when the reference clock and the feedback clock reach substantially a same frequency. The phase-locked loop also includes a delay circuit that asserts a step notification signal at a time delay after the lock signal is asserted. A bandwidth control counter generates an incremental current indicator after detecting a bandwidth change indicator. A duration of the incremental current indicator is correlated to a number of times the step notification signal is asserted and a predetermined number of bandwidth steps. An adjustable charge pump generates an adjustment signal responsive to the difference signal and the incremental current indicator. A low-pass filter generates a frequency adjustment signal responsive to the adjustment signal and a voltage-controlled oscillator generates an output clock with a variable frequency responsive to a voltage level of the frequency adjustment signal.

Another embodiment of the invention comprises a method that includes comparing a reference clock and a feedback clock to generate a difference signal and asserting a lock signal when the reference clock and the feedback clock reach substantially a same frequency. A step notification signal is asserted a time delay after the lock signal is asserted and an incremental current indicator is generated after detecting a bandwidth change indicator. A duration of the incremental current indicator is correlated to a number of times the step notification signal is asserted and a predetermined number of bandwidth steps. The method also includes generating an adjustment signal responsive to the difference signal and the incremental current indicator. A frequency adjustment signal is generated responsive to the adjustment signal and an output clock with a variable frequency is generated responsive a voltage level of the frequency adjustment signal.

Another embodiment of the invention comprises a method that includes indicating a desired change in frequency for a phase-locked loop and adjusting a reference clock frequency to a new frequency in response to the desired change in frequency. The method also includes phase and frequency locking the phase-locked loop to the reference clock and reducing a voltage spike of a frequency adjustment signal to a voltage-controlled oscillator. The voltage spike is reduced by detecting when the reference clock and a feedback clock reach substantially a same frequency, waiting for a time delay after the detecting, and adjusting a current level of a charge pump pulse by an incremental amount to achieve a fractional portion of a new loop bandwidth. The charge pump pulse is filtered to generate the frequency adjustment signal and the voltage spike reduction process is repeated until the new loop bandwidth is achieved.

Yet another embodiment of the invention comprises a method that includes indicating a desired change in frequency for a phase-locked loop and adjusting a reference clock frequency to a new frequency responsive to the desired change in frequency. The method also includes phase and frequency locking the phase-locked loop to the reference clock and changing a loop bandwidth of the phase-locked loop to a new loop bandwidth in response to the reference clock frequency adjustment. Changing the loop bandwidth includes detecting when the reference clock and a feedback clock reach substantially a same frequency, waiting for a time delay after the detecting, and adjusting a current level of a charge pump pulse by an incremental amount to achieve a fractional portion of the new loop bandwidth. The charge pump pulse is filtered to generate a frequency adjustment signal for a voltage-controlled oscillator and the loop bandwidth change process is repeated until the new loop bandwidth is achieved.

BRIEF DESCRIPTION OF THE SEVERAL VIEWS OF THE DRAWINGS

FIG. 1 illustrates a conventional phase-locked loop;

FIG. 2A is a circuit diagram of a low-pass filter that may be used with phase-locked loops;

FIG. 2B is a voltage response curve for a current pulse input to the low-pass filter of FIG. 2A;

DETAILED DESCRIPTION

Figure 3:
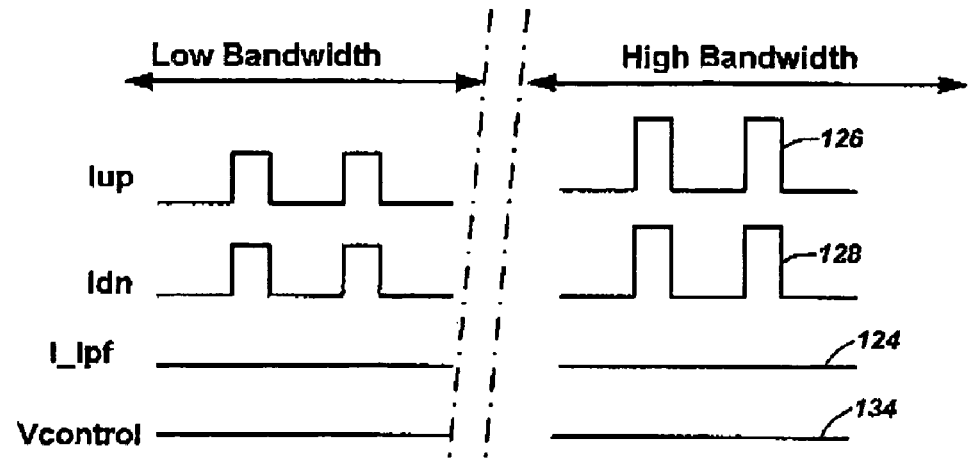
FIG. 3 is a timing diagram illustrating various control signals of a conventional phase-locked loop when a loop bandwidth of the phase-locked loop is changed and when there is no static phase error in the phase-locked loop.

Embodiments of the present invention include methods of phase locking to a reference clock and phase-locked loops that adjust to a change in frequency of the phase-locked loop. The phase-locked loop locks to a new reference frequency and incrementally adjusts a loop bandwidth in response to the frequency change.

In this description, circuits and functions may be shown in block diagram form in order not to obscure the present invention in unnecessary detail. Conversely, specific circuit implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

In this description, some drawings may illustrate signals as a single signal for clarity of presentation and description. It will be understood by a person of ordinary skill in the art that the signal may represent a bus of signals, wherein the bus may have a variety of bit widths and embodiments of the present invention may be implemented on any number of data signals including a single data signal.

The terms "assert" and "negate" are respectively used when referring to the rendering of a signal, status bit, or similar apparatus into its logically true or logically false state. If the logically true state is a logic level one, the logically false state will be a logic level zero. Conversely, if the logically true state is a logic level zero, the logically false state will be a logic level one.

Also, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process is terminated when its acts are completed. A process may correspond to a method, a function, a procedure, a subroutine, a subprogram, etc. Furthermore, the methods disclosed herein may be implemented in hardware, software, or both.

FIG. 1 illustrates a conventional PLL 100, which includes a phase-frequency detector 110, a charge pump 120, a low-pass filter 130 a voltage-controlled oscillator (VCO) 140, and a feedback divider 190. An output clock 142 is divided down to a reference clock 192 by the feedback divider 190. The phase-frequency detector 110 compares the phase and frequency of the feedback clock 192 to the reference clock 104. A difference signal 112 is generated by the phase-frequency detector 110 to indicate mismatches between the reference clock 104 and the feedback clock 192. In most cases, the difference signal includes an up signal indicating that the output clock 142 needs to increase in frequency and a down signal indicating that the output clock 142 needs to decrease in frequency. These up and down signals drive the charge pump 120, which generates one or more current pulses 122 with a duration that is indicative of how much correction is required in the output clock 142.

A low-pass filter 230 filters the current pulses 122 and creates a voltage signal 132 for the voltage-controlled oscillator 140. The frequency of the voltage-controlled oscillator 140 is adjusted based on the voltage level supplied to it by the low-pass filter 130.

The loop is closed such that the feedback clock 192 adjusts and eventually locks to the same frequency and close to the same phase as the reference clock 104. The open-loop transfer function of the PLL 100 is:

$$H(s) = \frac{Icp}{2 \cdot \pi} \cdot \frac{1 + s \cdot R1 \cdot C1}{s \cdot (C1 + C2) \cdot \left(1 + s \cdot \frac{R1 \cdot C1 \cdot C2}{C1 + C2}\right)} \cdot \frac{K_{VCO}}{s} \cdot \frac{1}{N} \quad \text{Equation 1}$$

in which, $I_{CP}$ is the charge-pump current, $K_{VCO}$ is the gain of the VCO, N is the divisor of the feedback divider, and R1/C1/C2 are resistance/capacitance values of the low-pass filter 130 as is explained below.

For stability reasons, C1 is usually set much greater than C2. Thus, from equation 1, the open-loop unit-gain bandwidth of the PLL can be approximated as:

$$\text{Bandwidth} = \frac{Icp \cdot R1 \cdot K_{VCO}}{2 \cdot \pi \cdot N} \cdot \frac{C1}{C1 + C2} \quad \text{Equation 2}$$

In the discussions herein, the loop bandwidth of the PLL 100 is being adjusted. For ease of description, bandwidth and loop bandwidth are used interchangeably herein. From Equation 2 it can be seen that in order to change the bandwidth of the PLL 100, a designer can change ICP, KVCO, N, R1, C1, or C2. However, KVCO, N, R1, C1, and C2 are often not good options for modification. KVCO is an intrinsic parameter of the VCO and it is often difficult to vary. The divisor N of the feedback divider 190 equals $f_{OUT}/f_{REF}$ and is unchangeable once $f_{OUT}$ and $f_{REF}$ are set. As for R1, C1 and C2, these filtering parameters are important to the stability of the PLL 100 and it is usually better not to change them to adjust bandwidth. As a result, the best parameter to change the bandwidth of the PLL 100 is the charge-pump current ICP.

In general, an overclocking process includes two steps: reaching a target frequency with an acceptable frequency ramp ratio and returning to a normal bandwidth with an acceptable frequency spike.

FIG. 2A is a circuit diagram of a low-pass filter 130 that may be used with phase-locked loops. FIG. 2B shows a voltage response curve for a current pulse input to the low-pass filter 130 of FIG. 2A. During the locking process, and while maintaining lock, the charge pump 120 sends a current pulse 124 of $I_{CP}$, which has a duration ΔT. During the locking process, the VCO frequency is chasing the reference frequency either from a higher to a lower frequency or from a lower to a higher frequency. To accomplish this frequency change, the duration of the pulses is generally related to a magnitude of the phase difference and frequency difference between the reference clock 104 and the feedback clock 192.

Between pulses, it is assumed that the low-pass filter 130 has settled at a stable voltage (VC) 134. In other words, VC 134 has reached a steady state voltage ΔVc before the charge pump sends its next current pulse. Consequently, before a current pulse, the voltages across capacitor C1 and capacitor C2 are equal, which means there is no current going through resistor R1. Then, the charge pump 120 sends a current pulse of $I_{CP}$ 124. Since the impedance of C2 is commonly far smaller than the series impedance of R1 and C1, all the current of ICP is injected into C2, causing a step change on voltage VC of ΔVs, which can be expressed as:

$$\Delta V_S = \frac{I_{CP} \cdot \Delta T}{C2} \qquad \text{Equation 3}$$

After a time ΔT, the current of Icp goes back to zero. Then, C2 begins to share its electric charge with C1 through R1, causing the final stable variation of Vc to be ΔVc, which can be expressed as:

$$\Delta V_C = \frac{I_{CP} \cdot \Delta T}{C1 + C2} \qquad \text{Equation 4}$$

As a result, the frequency change of the PLL 100 can be expressed as:

$$\Delta f = \Delta V_C \cdot K_{VCO} = \frac{I_{CP} \cdot \Delta T \cdot K_{VCO}}{C1 + C2} \qquad \text{Equation 5}$$

The frequency ramp ratio may be defined as:

$$\text{FrequencyRampRatio} = \Delta f_{overclock} / \Delta T \qquad \text{Equation 6}$$

Combining equations 5 and 6, the frequency ramp ratio can be approximately given as:

$$\text{FrequencyRampRatio} = \frac{I_{CP} \cdot K_{VCO}}{C1 + C2} \qquad \text{Equation 7}$$

Equation 7 shows that the frequency ramp ratio can be easily achieved with relatively small charge pump currents. When the PLL 100 reaches the final frequency with an acceptable frequency ramp ratio, the bandwidth of the PLL 100 can be changed back to its normal working bandwidth, which is usually much higher.

FIG. 3 is a timing diagram illustrating various control signals of a conventional phase-locked loop 100 when the loop bandwidth of the phase-locked loop is changed and when there is no static phase error in the phase-locked loop. FIG. 3 shows what will happen in an ideal PLL when the charge pump current becomes abruptly larger. In this figure, the Iup 126 and Idn 128 refer to the current values of the charge pump sources and sinks, which respond to the up signal and down signal, respectively. I_Ipf 124 is a combination of the Iup 126 and Idn 128 currents, which is the signal that is injected into the low-pass filter 130. Vcontrol is the control voltage for the VCO 140, which is generated by the low-pass filter 130. In a real charge-pump PLL, in order to erase potential dead zones of a charge pump, the Iup and Idn will both be on for a short time in each reference period. FIG. 3 illustrates an ideal PLL that is locked and has a negligible static phase error. As a result, Iup 126 and Idn 128 exactly overlap and combine to generate I_Ipf 128 with no current pulses. Thus, the charge pump 120 sources or sinks no current to or from the low-pass filter 130 once the PLL 100 is locked. In other words, the frequency of the output clock 142 of this locked PLL is no longer correlated with the values of charge pump currents. Since there are no current pulses to the low-pass filter 130, there are no changes to the voltage to the VCO 140. Thus, the bandwidth of the PLL 100 can be changed by increasing the amplitude of the current pulses (as shown on the high bandwidth side of FIG. 3), Vcontrol 134 will not change, and there will be no frequency spikes.

Figure 4:
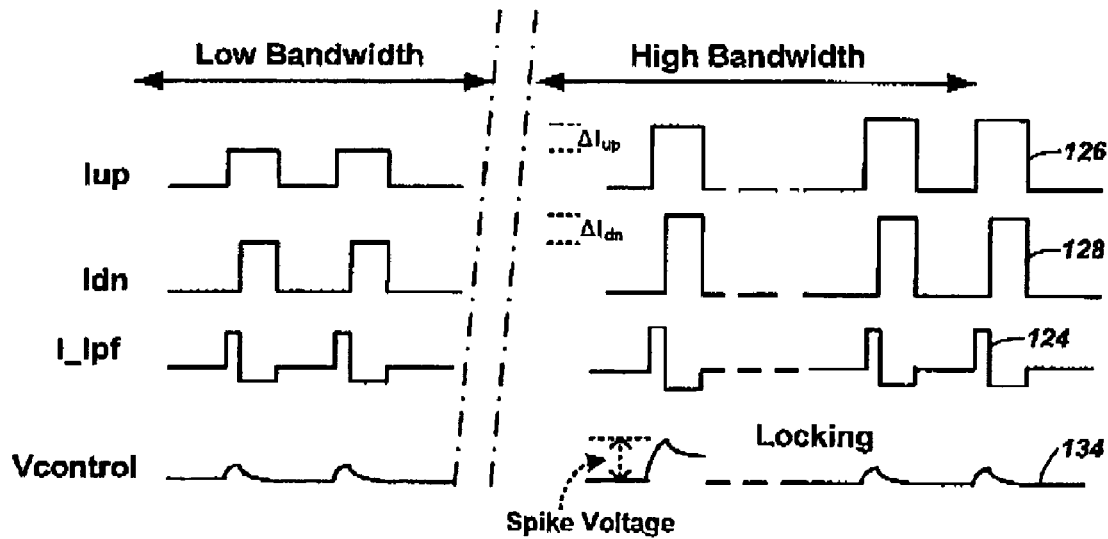
FIG. 4 is a timing diagram illustrating various control signals of a conventional phase-locked loop when a loop bandwidth of the phase-locked loop is changed and when there is a static phase error in the phase-locked loop.

FIG. 4 is a timing diagram illustrating various control signals of a conventional phase-locked loop when a loop bandwidth of the phase-locked loop is changed and when there is a static phase error ($\theta_e$) in the phase-locked loop. Due to system imperfections, such as device mismatch or current leakage, most PLLs have a static phase error when the PLL is in lock. As a result, the PLL stays in a dynamic lock state, with the charge pump 120 sourcing or sinking current from time to time. As a result, the PLL output frequency suffers a small amount of variation, which manifests as jitter in time domain.

In FIG. 4, the low bandwidth side illustrates a locked PLL with low bandwidth and Vcontrol 134 has relatively small voltage spikes due to the small static phase error. However, if the PLL is abruptly changed to a high bandwidth by increasing the Iup 126 pulse by $\Delta I_{UP}$ and increasing the Idn pulse by $\Delta I_{DN}$, a large voltage spike is experienced on Vcontrol 134. This large voltage spike will gradually diminish over multiple reference periods. The large voltage spike can cause a corresponding large frequency spike, which can be represented by:

$$f_{SPIKE} = \frac{\theta_e}{2 \cdot \pi \cdot f_{REF}} \cdot \frac{\Delta I_{CP} \cdot K_{VCO}}{C2} \qquad \text{Equation 8}$$

Since this current change and resulting voltage spike can break the dynamic balance state of the PLL, the PLL may start a new locking process, through which the PLL drags the frequency back to the right frequency with the static phase error.

However, from equation 8, it can be seen that reducing the change of charge pump current (i.e., $\Delta I_{CP}$) will reduce the frequency spike. In embodiments of the present invention, the bandwidth change is divided into N steps such that the change of charge pump current of each step is reduced. Assuming each step changes the charge pump current equally, $\Delta I_{CPN} = \Delta I_{CP}/N$, resulting in a reduced frequency spike for each step that can be expressed as:

$$f_{SPIKE\_N} = \frac{1}{N} \cdot \frac{\theta_e}{2 \cdot \pi \cdot f_{REF}} \cdot \frac{\Delta I_{CP} \cdot K_{VCO}}{C2} \qquad \text{Equation 9}$$

Embodiments of the present invention provide a way to largely reduce the frequency spike that can occur in a PLL when overclocking is ongoing. To avoid a large frequency spike when the PLL is changed, two or more incremental bandwidth changes may be used to achieve the new loop bandwidth for the PLL during overclocking. Since the total bandwidth change (e.g., change from a low loop bandwidth to the new high loop bandwidth) of the PLL is predetermined, the more the steps of bandwidth change used, the smaller the frequency spike will be for each step of bandwidth. This results in a smooth bandwidth change and frequency spikes are dramatically reduced.

Figure 5:
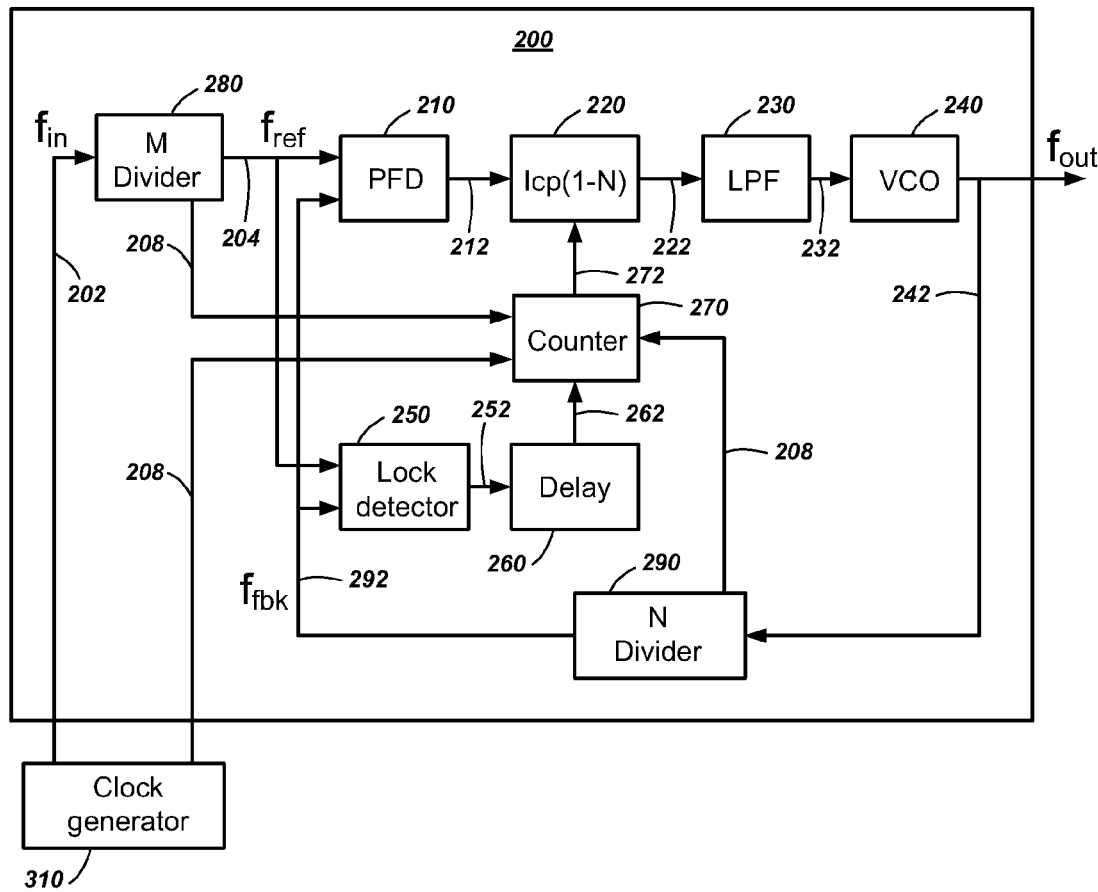
FIG. 5 is a simplified block diagram of a phase-locked loop according to one or more embodiments of the present invention.

FIG. 5 is a simplified block diagram of a phase-locked loop according to one or more embodiments of the present invention. The PLL 200 includes a phase-frequency detector 210, a charge pump 220, a low-pass filter 230, and a voltage-controlled oscillator 240 to generate an output clock 242. As with the conventional PLL 100 (FIG. 1), PLL 200 may include a feedback divider as an N divider 290, which divides an output clock 242 down to a feedback clock 292. Additionally, some embodiments may include an M divider 280, which divides an input clock 202 down to a reference clock 204. Thus, the frequency of the output clock may be represented as $$f_{OUT} = \frac{f_{IN}}{M} * N \qquad \text{Equation 10}$$

It should be noted that the variable "N" is being used to designate a value for the feedback divider as well as a number of incremental steps for the bandwidth adjustment. Similarly, the variable "M" is being used to designate a value for the input divider as well as a desired bandwidth. Based on the context of the discussion, there should be no confusion in which N and M is being discussed.

The phase-frequency detector 210 compares the phase and frequency of the feedback clock 292 to a reference clock 204. A difference signal 212 is generated by the phase-frequency detector 210 to indicate mismatches between the reference clock 204 and the feedback clock 292. In many cases, the difference signal includes an up signal indicating that the feedback clock 292 needs to increase in frequency and a down signal indicating that the feedback clock 292 need to decrease in frequency. These up and down signals drive an adjustable charge pump 220 that generates one or more current pulses 222 with a duration that is indicative of how much correction is required in the feedback clock 292. A low-pass filter 230 filters the current pulses and creates a frequency adjustment signal 232 for the voltage-controlled oscillator 240. The low-pass filter 230 may be similar to, or identical to, the low-pass filter 130 shown in FIGS. 2A and 2B, as discussed above. The frequency of the voltage-controlled oscillator 240 is adjusted based on the voltage level supplied to it by the low-pass filter 230.

The loop is closed such that the feedback clock 292 (which is the output clock 242 divided by N) adjusts and eventually locks to the same frequency and close to the same phase as the reference clock 204.

The current of the adjustable charge pump 220 is programmed and controlled by a bandwidth control counter 270, which generates an incremental current indicator 272. The bandwidth control counter counts the number of bandwidth change steps N that are to be performed when changing the loop bandwidth. This value N may be a hard-wired value or may be a programmable value that may be set.

A lock detector 250 coarsely judges whether the PLL is in lock or not and asserts a lock signal 252, for example, as a pulse. In other words, the lock detector 250 determines when the PLL is frequency locked, but may not have yet achieved the small static phase error.

A delay circuit 260 waits a delay time $T_{WAIT}$, after it receives the lock signal 252 to assert a step notification signal 262, for example, as a pulse. This wait time may allow for the static phase error to stabilize. The bandwidth change radix may be defined as the ratio of two adjacent bandwidths. The closer the ratio is to one, the smoother the bandwidth change with a concurrent increase in the number of bandwidth change steps. For each step of bandwidth change, the radix can be different. However, in some embodiments, in order to simplify the design of the number of bandwidth change steps N and the waiting time $T_{WAIT}$, the bandwidth change radix may be set to the same value for each step.

For example, if the bandwidth change radix is set as 2, then bandwidth M equals twice the bandwidth (M−1), where M is bigger than 2 but no more than N. To determine N, we should know how big bandwidth N is relative to bandwidth 1. For example, if bandwidth N is 110 times larger than bandwidth 1, then N is the integer, which makes $2^N$ larger than, and closest to 110 (e.g., an N of 7 can be used). Since $2^N$ (i.e., 128) is larger than 110, the last bandwidth change will not change from bandwidth (N−1) to 2*bandwidth (N−1), but to its normal working bandwidth (i.e., bandwidth N). In this way, there will be six bandwidth changes and each time the bandwidth is doubled except the last time, which will have a smaller bandwidth change.

The waiting time $T_{WAIT}$ is closely related to the bandwidth 1. Considering bandwidth 2 is twice bandwidth 1, by doubling the charge pump current Icp the instantaneous phase error before a bandwidth change should not only counteract the multiplier 2, but also enable the output frequency spike to meet a reduced frequency spike requirement. Thus, the number of bandwidth steps and the $T_{WAIT}$ time will determine the magnitude of the instantaneous phase error. Simulations with behavioral models through mathematical analysis software or circuit analysis software may be used to determine the duration of the waiting time $T_{WAIT}$. Of course, with a longer $T_{WAIT}$ there will be a smaller static phase error between steps, but it will take longer to achieve the final desired bandwidth.

When overclocking is desired, the reference frequency is changed. This change may be accomplished by programming the N divider 290 to a new value, programming the M divider 280 to a new value, or a combination thereof. In addition, in some embodiments, a clock generator 310 may change the frequency of the input clock 202. When the frequency is changed, the incremental bandwidth change process may be employed. Thus, the desired change in frequency is signaled to the bandwidth control counter 270 using a bandwidth change indicator 208, which may come from the clock generator 310, the M divider 280, the N divider 290, or any combination thereof depending on how the frequency change is caused.

The bandwidth change indicator 208 resets the bandwidth control counter 270 and subsequently each assertion of the step notification signal 262 causes the bandwidth control counter 270 to count until the total count of N is achieved. Of course, the bandwidth control counter 270 may be implemented as an up or down counter.

Figure 6:
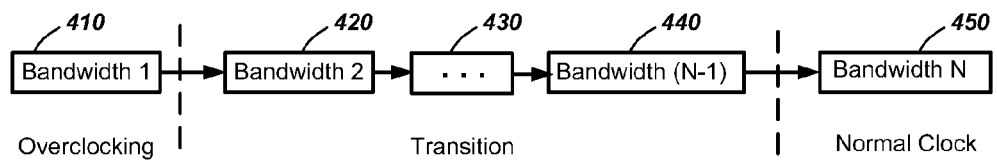
FIG. 6 is a process diagram showing a transition from a low loop bandwidth to a high loop bandwidth for the phase-locked loop of FIG. 5.

FIG. 6 is a process diagram showing a transition from a low loop bandwidth to a high loop bandwidth for the phase-locked loop of FIG. 5. When overclocking is initiated, the bandwidth change process begins at bandwidth 1 (410). Then, a transition process occurs to normal clocking at bandwidth N (450).

The transition process may include any number of bandwidth steps, as shown by 420, 430, and 440. After each step of bandwidth change, a controllable frequency spike occurs, which is determined by equation 9, and the PLL starts a new locking process, achieving a new static phase error. Then, another bandwidth change happens and the frequency spike is again determined by equation 9. When the PLL returns to its normal bandwidth, no individual frequency spike is higher than a desired maximum frequency spike.

Figure 7:
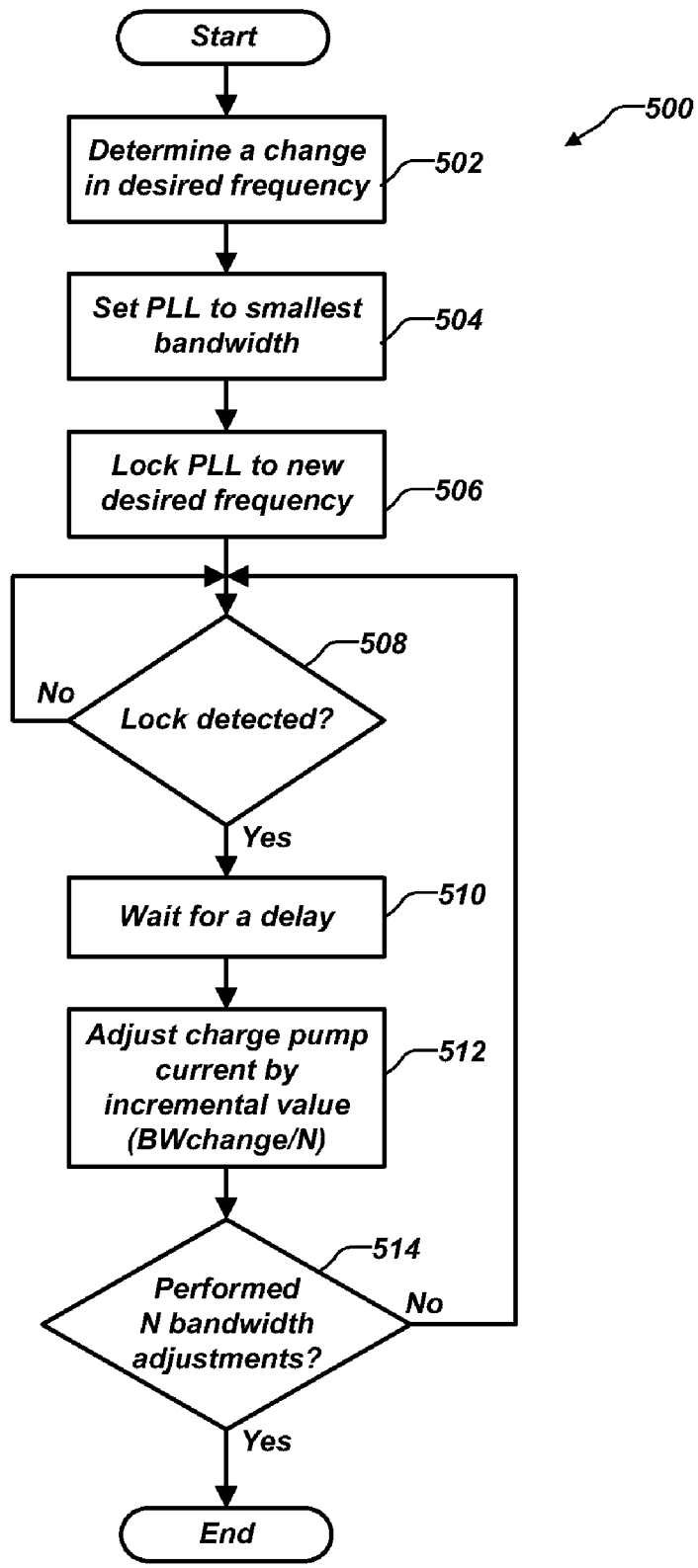
FIG. 7 is a flow diagram showing acts that may be performed in one or more embodiments of the present invention.

FIG. 7 is a flow diagram showing acts that may be performed in one or more embodiments of the present invention. The process 500 starts at block 502 when a desired frequency change is indicated. Block 504 indicates that the PLL is set to a smallest desired bandwidth. Block 506 indicates that the PLL locks to the new desired frequency.

Block 508 indicates a test to see if the lock detector 250 (FIG. 5) has detected a lock. If not, the process loops until the lock is detected. When a lock is detected, block 510 indicates that the process waits for a time delay $T_{WAIT}$. Operation block 512 indicates that the process adjusts the charge pump current by an incremental value as explained above. As a non-limiting example, the incremental change may be proportional to the total desired bandwidth change divided by the number of steps N.

Block 514 tests to see if a total of N steps have been performed. If not, the process loops back to block 508 and the bandwidth incrementing process is repeated. If a total of N steps have been performed, the process exits.

Figure 8:
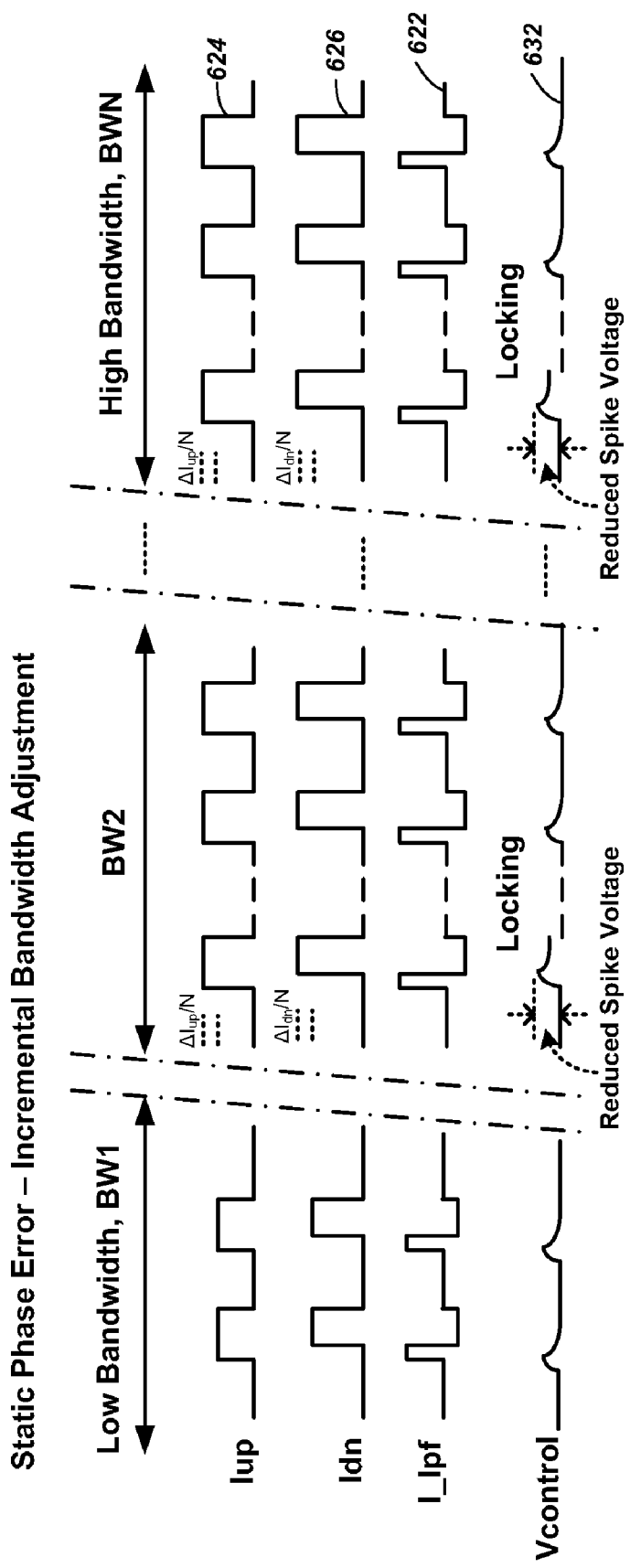
FIG. 8 is a timing diagram illustrating various control signals of the phase-locked loop of FIG. 5 when a loop bandwidth of the phase-locked loop is changed and when there is a static phase error in the phase-locked loop.

FIG. 8 is a timing diagram illustrating various control signals of the phase-locked loop of FIG. 5 when a loop bandwidth of the phase-locked loop is changed and when there is a static phase error in the phase-locked loop. In a similar fashion to FIG. 4, Iup 624 and Idn 626 refer to the current values of the charge pump sources and sinks, which respond to the up signal and down signal, respectively. I_Ipf 622 is a combination of the Iup 624 and Idn 626 currents, which is the signal that is injected into the low-pass filter 230. Vcontrol 632 is the control voltage for the VCO 240, which is generated by the low-pass filter 230. In most PLLs, in order to erase potential dead zones of a charge pump, the Iup 624 and Idn 626 will both be on for a short time in each reference period.

Due to system imperfections, such as device mismatch or current leakage, most PLLs have a static phase error when the PLL is in lock. As a result, the PLL stays in a dynamic lock state, with the charge pump 120 sourcing or sinking current from time to time. As a result, the PLL output frequency suffers a small amount of variation, which manifests as jitter in time domain.

In FIG. 8, the low bandwidth side illustrates a locked PLL with low bandwidth and Vcontrol 632 has relatively small voltage spikes due to the small static phase error. In addition, the center segment of FIG. 8 illustrates incremental bandwidth increase steps as BW2 through BW(N−1). In each of the incremental bandwidth steps the amplitude of Iup 624 and Idn 626 is increased by a fractional portion $\Delta I_{UP}/N$ and $\Delta I_{DN}/N$, respectively. As a result of the fractional increase, the spike voltage on Vcontrol 632 is reduced and any frequency spike produced by the VCO is reduced.

The final incremental bandwidth change is indicated on the right side of FIG. 8 as the BWN step. Thus, after each step of bandwidth change, a controllable frequency spike occurs as determined by equation 9 and the PLL starts a new locking process and achieving a new static phase error. Then, another bandwidth change happens and the frequency spike is also determined by equation 9. The process repeats until normal high bandwidth is achieved with no frequency spikes above the allowable threshold.

When the PLL is overclocking with bandwidth 1, a proper design will meet the requirements for the frequency ramp ratio according to equation 6. Considering device mismatch and other random noise, the static phase error of the PLL will be a tiny constant. After the PLL is locked, the instantaneous phase error will run close to the static phase error over time. Since it would be inappropriate to wait an endless time to get the smallest static phase error, the waiting time after lock may be chosen to achieve the desired bandwidth change with an acceptable frequency spike according to equation 9.

For a simple embodiment, the waiting time $T_{WAIT}$ in all bandwidth increments may be the same. In addition, since bandwidth 2 is larger than bandwidth 1, the instantaneous phase error at time $T_{WAIT}$ for bandwidth 2 is smaller than that with bandwidth 1. Hence, the following frequency spike is a little smaller.

When the PLL finishes running with bandwidth 2 for a time of $T_{WAIT}$, the PLL changes from bandwidth 2 to bandwidth 3, and so on. Finally, the PLL returns to its normal working bandwidth N with an acceptable frequency spike throughout the process.

While the present invention has been described herein with respect to certain preferred embodiments, those of ordinary skill in the art will recognize and appreciate that it is not so limited. Rather, many additions, deletions, and modifications to the preferred embodiments may be made without departing from the scope of the invention as hereinafter claimed. In addition, features from one embodiment may be combined with features of another embodiment while still being encompassed within the scope of the invention as contemplated by the inventors.

What is claimed is:

1. A phase-locked loop, comprising:
   a phase-frequency detector for comparing a reference clock and a feedback clock to generate a difference signal;
   a lock detector for comparing the reference clock and the feedback clock and asserting a lock signal when the reference clock and the feedback clock reach substantially a same frequency;
   a delay circuit for asserting a step notification signal a time delay after the lock signal is asserted;
   a bandwidth control counter for generating an incremental current indicator after detecting a bandwidth change indicator, wherein a duration of the incremental current indicator is correlated to a number of times the step notification signal is asserted and a predetermined number of bandwidth steps;
   an adjustable charge pump for generating an adjustment signal responsive to the difference signal and the incremental current indicator;
   a low-pass filter for generating a frequency adjustment signal responsive to the adjustment signal; and
   a voltage-controlled oscillator for generating an output clock with a variable frequency responsive to a voltage level of the frequency adjustment signal.

2. The phase-locked loop of claim 1, further comprising:
   an M divider for dividing an input clock by M to generate the reference clock; and
   an N divider for dividing the output clock by N to generate the feedback clock.

3. The phase-locked loop of claim 2, wherein the bandwidth change indicator is asserted responsive to a change in value for the M divider, a change in value for the N divider, or a combination thereof.

4. The phase-locked loop of claim 1, wherein the bandwidth change indicator is asserted responsive to a change in frequency of a clock generator for generating the reference clock.

5. The phase-locked loop of claim 1, wherein:
the adjustment signal comprises a combination of an up pulse and a down pulse; and
while the incremental current indicator is asserted;
a current of the up pulse is increased by an incremental amount; and
a current of the down pulse is increased by the incremental amount.

6. The phase-locked loop of claim 5, wherein the incremental amount is a total current change amount for achieving a new loop bandwidth for the phase-locked loop divided by the predetermined number of bandwidth steps.

7. The phase-locked loop of claim 5, wherein the up pulse has a duration responsive to an indication of an increase in frequency from the difference signal and the down pulse has a duration responsive to an indication of a decrease in frequency from the difference signal.

8. The phase-locked loop of claim 1, wherein the loop filter comprises a passive circuit.

9. The phase-locked loop of claim 1, wherein the bandwidth control counter is configured to:
reset upon detection of the bandwidth change indicator;
assert the incremental current indicator upon detection of the bandwidth change indicator;
count upon each assertion of the step notification signal; and
negate the incremental current indicator upon counting to the predetermined number of bandwidth steps.

10. A method, comprising:
comparing a reference clock and a feedback clock to generate a difference signal;
asserting a lock signal when the reference clock and the feedback clock reach substantially a same frequency;
asserting a step notification signal a time delay after the lock signal is asserted;
generating an incremental current indicator after detecting a bandwidth change indicator, wherein a duration of the incremental current indicator is correlated to a number of times the step notification signal is asserted and a predetermined number of bandwidth steps;
generating an adjustment signal responsive to the difference signal and the incremental current indicator;
generating a frequency adjustment signal responsive to the adjustment signal; and
generating an output clock with a variable frequency responsive a voltage level of the frequency adjustment signal.

11. The method of claim 10, further comprising:
dividing the output clock by N to generate the feedback clock; and
dividing an input clock by M to generate the reference clock.

12. The method of claim 10, wherein the bandwidth change indicator is generated responsive to an indication from a clock generator, a change in value for M, a change in value for N, or a combination thereof.

13. The method of claim 10, wherein
generating the adjustment signal further comprises combining an up pulse and a down pulse; and
while the incremental current indicator is asserted;
increasing a current of the up pulse by an incremental amount; and
increasing a current of the down pulse by the incremental amount.

14. The method of claim 13, wherein the incremental amount is a total current change amount divided by the predetermined number of bandwidth steps.

15. The method of claim 13, wherein the up pulse has a duration responsive to an indication of an increase in frequency from the difference signal and the down pulse has a duration responsive to an indication of a decrease in frequency from the difference signal.

* * * * *